US007483039B1

(12) United States Patent
Alben et al.

(10) Patent No.: US 7,483,039 B1
(45) Date of Patent: *Jan. 27, 2009

(54) SYSTEM FOR PROGRAMMABLE DITHERING OF VIDEO DATA

(75) Inventors: Jonah M. Alben, San Jose, CA (US); Stephen Lew, Sunnyvale, CA (US)

(73) Assignee: NVIDIA Corporation, Santa Clara, CA (US)

( * ) Notice: Subject to any disclaimer, the term of this patent is extended or adjusted under 35 U.S.C. 154(b) by 439 days.

This patent is subject to a terminal disclaimer.

(21) Appl. No.: 11/258,708

(22) Filed: Oct. 26, 2005

Related U.S. Application Data

(62) Division of application No. 10/233,657, filed on Sep. 3, 2002, now Pat. No. 6,982,722.

(60) Provisional application No. 60/406,420, filed on Aug. 27, 2002.

(51) Int. Cl.
*G09G 5/22* (2006.01)
*G09G 5/00* (2006.01)
*G09G 5/02* (2006.01)
*H03M 1/12* (2006.01)
*H04N 5/00* (2006.01)
*H04N 1/60* (2006.01)
*G06K 15/00* (2006.01)

(52) U.S. Cl. ....................... 345/596; 345/606; 345/547; 345/549; 345/589; 348/574; 348/607; 358/1.9; 358/3.13; 358/533; 382/162

(58) Field of Classification Search ......... 345/588–589, 345/596, 600, 605–606, 618, 501, 547, 549, 345/611, 690; 358/1.9, 3.03, 3.13–3.19, 358/533–535; 382/162, 164, 177, 181, 252, 382/254; 348/571, 574, 575, 606, 607
See application file for complete search history.

(56) References Cited

U.S. PATENT DOCUMENTS 5,905,504 A 5/1999 Barkans et al.
5,956,468 A * 9/1999 Ancin ........................ 358/1.9
6,147,671 A 11/2000 Agarwal
6,982,722 B1 * 1/2006 Alben et al. ................ 345/596

* cited by examiner

*Primary Examiner*—Wesner Sajous
(74) *Attorney, Agent, or Firm*—Patterson & Sheridan, L.L.P.

(57) ABSTRACT

A programmable system for dithering video data. The system is operable in at least two user-selectable modes which can include a small kernel mode and a large kernel mode. In some embodiments, the system is operable in at least one mode in which it applies two or more kernels (each from a different kernel sequence) to each block of video words. Each kernel sequence repeats after a programmable number of the blocks (e.g., a programmable number of frames containing the blocks) have been dithered. The period of repetition is preferably programmable independently for each kernel sequence. The system preferably includes a frame counter for each kernel sequence. Each counter generates an interrupt when the number of frames of data dithered by kernels of the sequence has reached a predetermined value. In response to the interrupt, software can change the kernel sequence being applied. Typically, the system performs both truncation and dithering on words of video data. For example, some embodiments produce dithered 6-bit color components in response to 8-bit input color component words. Preferably, the inventive system is optionally operable in either a normal mode (in which dithering is applied to all pixels in accordance with the invention) or in an anti-flicker mode. Another aspect of the invention is a computer system in which the dithering system is implemented as a subsystem of a pipelined graphics processor or display device. Another aspect of the invention is a display device that includes an embodiment of the dithering system.

19 Claims, 4 Drawing Sheets

SYSTEM FOR PROGRAMMABLE DITHERING OF VIDEO DATA

CROSS-REFERENCE TO RELATED APPLICATIONS

This application is a divisional of U.S. patent application Ser. No. 10/233,657 filed on Sep. 3, 2002 now U.S. Pat. No. 6,982,722, which claims the benefit of U.S. Provisional Patent Application No. 60/406,420 filed on Aug. 27, 2002.

TECHNICAL FIELD OF THE INVENTION

The invention relates to computer systems in which a graphics processor (e.g., a pipelined graphics processor) or a display device dithers video data during generation of fully processed video data for display. The invention also pertains to graphics processors and display devices configured for programmable dithering of video data, and to systems including (and programmable dithering circuitry for use in) such a graphics processor or display device.

BACKGROUND OF THE INVENTION

In three dimensional graphics, surfaces are typically rendered by assembling a plurality of polygons in a desired shape. The polygons (which are typically triangles) are defined by vertices, and each vertex is defined by three dimensional coordinates in world space, by color values, and by texture coordinates.

The surface determined by an assembly of polygons is typically intended to be viewed in perspective. To display the surface on a computer monitor, the three dimensional world space coordinates of the vertices are transformed into screen coordinates in which horizontal and vertical values (x, y) define screen position and a depth value z determines how near a vertex is to the screen and thus whether that vertex is viewed with respect to other points at the same screen coordinates. The color values define the brightness of each of red/green/blue (r, g, b) color at each vertex and thus the color (often called diffuse color) at each vertex. Texture coordinates (u, v) define texture map coordinates for each vertex on a particular texture map defined by values stored in memory.

The world space coordinates for the vertices of each polygon are processed to determine the two-dimensional coordinates at which those vertices are to appear on the two-dimensional screen space of an output display. If a triangle's vertices are known in screen space, the positions of all pixels of the triangle vary linearly along scan lines within the triangle in screen space and can thus be determined. Typically, a rasterizer uses (or a vertex processor and a rasterizer use) the three-dimensional world coordinates of the vertices of each polygon to determine the position of each pixel of each surface ("primitive" surface") bounded by one of the polygons.

The color values of each pixel of a primitive surface (sometimes referred to as a "primitive") vary linearly along lines through the primitive in world space. A rasterizer performs (or a rasterizer and a vertex processor perform) processes based on linear interpolation of pixel values in screen space, linear interpolation of depth and color values in world space, and perspective transformation between the two spaces to provide pixel coordinates and color values for each pixel of each primitive. The end result of this is that the rasterizer outputs a sequence red/green/blue color values (conventionally referred to as diffuse color values) for each pixel of each primitive.

One or more of the vertex processor, the rasterizer, and a texture processor compute texture coordinates for each pixel of each primitive. The texture coordinates of each pixel of a primitive vary linearly along lines through the primitive in world space. Thus, texture coordinates of a pixel at any position in the primitive can be determined in world space (from the texture coordinates of the vertices) by a process of perspective transformation, and the texture coordinates of each pixel to be displayed on the display screen can be determined. A texture processor can use the texture coordinates (of each pixel to be displayed on the display screen) to index into a corresponding texture map to determine texels (texture color values at the position defined by the texture coordinates for each pixel) to vary the diffuse color values for the pixel. Often the texture processor interpolates texels at a number of positions surrounding the texture coordinates of a pixel to determine a texture value for the pixel. The end result of this is that the texture processor generates data determining a textured version of each pixel (of each primitive) to be displayed on the display screen.

Typical graphics processors used in computer graphics systems produce 32-bit words of video data ("pixels"). Each word comprises four 8-bit color component words (e.g., a red, green, blue, and alpha component). Typical display devices display 24-bit pixels (each pixel comprising three 8-bit color components, e.g., red, green, and blue components) determined by a stream of such 32-bit video data words. However, some display devices (e.g., some flat panel displays) are configured to display 18-bit pixels, each comprising three 6-bit color component words. More generally, some display devices (e.g., some flat panel displays) are configured to display M-bit pixels (where $M=3N$, and $N<8$), each pixel comprising three N-bit color component words. In order to generate video data for display on an 18-bit display device, a graphics processor that generates 32-bit pixels can operate in a mode in which the two least significant bits of each 8-bit green component, 8-bit red component, and 8-bit blue component determined by the 32-bit pixels are truncated to generate 18-bit output pixels (each comprising three 6-bit color components) which are provided to the display device.

However, undesired visible artifacts (such as banding) can result from such truncation of video data. In order to reduce such artifacts, some conventional graphics processors employ spatial dithering. Spatial dithering introduces noise to the least significant bit (or bits) of the displayed pixels by applying specially-chosen dither bits to blocks of color component words. For example, visible banding can result when Y-bit pixels of a frame of input video data (indicative of a continuously decreasing color across a region) are truncated to X-bit pixels (where $X<Y$) to produce a frame of X-bit output data and the frame of X-bit output data is displayed (due to sudden transitions across the region in the values of the least significant bits of the displayed output words). Spatial dithering can add noise to the least significant bits of the output words to prevent such banding. However, when a purely spatial dither pattern is applied (so that the dither pattern does not vary from frame to frame) the pattern can be very visible, especially if the display bit depth is low (e.g., when displaying 12-bit pixels, each comprising three 4-bit components).

Temporal dithering attempts to make dither pattern application invisible by varying the applied pattern from frame to frame. When employing temporal dithering, the noise (dither pattern sequence) added to a sequence of frames should have a time average substantially equal to zero, in the following sense. If the undithered data is a stream of identical pixels, the pixels of each frame of the dithered data will not all be identical, but the time average (over many frames of the dithered data) of the color displayed at each pixel location on the display screen should not differ significantly from the color of the displayed undithered data.

However, depending on the algorithm used to vary an applied dither pattern from frame to frame, temporal dithering cause the undesirable visible artifact known as "flicker." Flicker results when dithering produces a sequence of pixels that are displayed at the same location on a display screen with periodically varying intensity, especially where the frequency at which the intensity varies is in a range to which the eye is very sensitive. The human eye is very sensitive to flicker that occurs at about 15 Hz, and more generally is sensitive to flicker in the range from about 4 Hz to 30 Hz (with increasing sensitivity from 4 Hz up to 15 Hz and decreasing sensitivity from 15 Hz up to 30 Hz). If the pixels displayed at the same screen location (with a frame rate of 60 Hz) have a repeating sequence of intensities (within a limited intensity range) that repeats every four frames due to dithering, a viewer will likely perceive annoying 15 Hz flicker, especially where each frame contains a set of identical pixels of this type that are displayed contiguously in a large region of the display screen. However, if the pixels displayed at the same screen location (with a frame rate of 60 Hz) have a repeating sequence of intensities (in the same intensity range) that repeats every sixteen frames, a viewer will be much less likely to perceive as flicker the resulting 3.75 Hz flicker.

It is known to perform temporal dithering in such a manner as to reduce flicker during viewing of the resulting video frames, by applying a repeating sequence of dither bits with a sufficiently long period of repetition. However, until the present invention, temporal dither had not been implemented in a programmable manner that allows the user to vary both spatial and temporal dither parameters and select a parameter set that results in a desired combination of system performance and displayed image quality (e.g., an acceptably small amount of flicker).

Until the present invention, neither a graphics processor nor a display device had been implemented to perform both spatial and temporal dither efficiently in any of multiple user-selectable modes with selectable dither parameters, so that a user can select a mode and parameter set that results in a desired combination of system performance and displayed image quality. Nor, until the present invention, had a system had been implemented to include such a programmable graphics processor or display device that is operable in at least one mode in which pixels of a first length (e.g., 24-bit pixels) are displayed, and at least two other modes in which temporally and spatially dithered pixels of a shorter length (e.g., 18-bit pixels) are displayed (e.g., on a flat panel device capable only of displaying pixels having 18-bit maximum length). Nor, until the present invention, had such a system been implemented to be allow user selection of kernel size during spatial dithering, or to allow application of long dither sequences (having selected period) while minimizing the amount of memory required to store the dither bits to be applied.

SUMMARY OF THE INVENTION

In a class of embodiments, the invention is a programmable system for dithering video data. The system is operable in at least two user-selectable modes, which can include at least one "small kernel" mode and at least one "large kernel" mode. In a small kernel mode, the system applies a sequence of N bit×N bit dither bit arrays (N bit×N bit "kernels") to N×N blocks of video words (e.g., red, green, or blue color components). In the large kernel mode, the system applies a sequence of M bit×M bit kernels (where M>N, so that each M×M kernel is sometimes referred to as a "large kernel") to M×M blocks of video words. Each sequence comprises a predetermined, and preferably programmable, number of kernels and the sequence repeats after a predetermined number of video blocks have been dithered. Typically, one kernel in the sequence is repeatedly applied to blocks of one video frame, the next kernel in the sequence is then repeatedly applied to blocks of the next video frame, and so on until each kernel has been applied to a different frame (at which point the process can repeat or new sequence of kernels can be applied). In some embodiments, each dither bit of each kernel of a kernel sequence is added to a specific bit of a video word (i.e., to the "P"th bit of the word, which can be the least significant bit). The system can store a finite number of predetermined dither bits in one or more registers.

In a class of embodiments, the inventive system is operable in at least one mode in which it applies two or more kernels (each from a different kernel sequence) to each set of input video bits (e.g., to each block of input video words). In some such embodiments, a kernel of a first kernel sequence is applied to the least significant bits (LSBs) of the words of each block of one frame (e.g., by adding one dither bit of the kernel to the LSB of each word) and a kernel of a second kernel sequence is applied to the next-least-significant bits of the words of each block of the same frame. Then, the next kernel of the first kernel sequence is applied to the LSBs of the words of each block of the next frame and the next kernel of the second kernel sequence is applied to the next-least-significant bits of the words of each block of the same frame, and so on for subsequent frames. Typically, the kernels of all sequences have the same size but this is need not be the case (for example, a sequence of large kernels and a sequence of small kernels can be simultaneously applied).

Typically, each kernel sequence is applied repeatedly but the period of repetition need not be the same for all simultaneously applied sequences. Preferably, the period of repetition is programmable independently for each sequence. For example, in one embodiment, a first kernel sequence comprises S kernels and a second kernel sequence comprises T kernels (where S and T are programmable numbers), and the following operations are performed simultaneously: the first kernel sequence is applied repeatedly (with a period of S frames) to successive groups of data blocks (each group consisting of S frames of data blocks), and the second kernel sequence is applied repeatedly (with a period of T frames) to successive groups of the same data blocks (each group consisting of T frames of data blocks). In this way, the overall period of repetition of the combination of both sequences is U frames, where U=S*T.

Regardless of the number of kernel sequences applied to a stream of data blocks, the system preferably includes a frame counter for each kernel sequence. Each counter preferably generates an interrupt when the frame count (the number of frames of data dithered by kernels of the sequence) has reached a predetermined value (preferably a programmable value). In response to the interrupt, software can change the kernel sequence being applied, thus effectively causing the system to apply a longer kernel sequence. For example, in response to the interrupt, a CPU can cause a new set of dither bits to be loaded into a register to replace dither bits that had been stored and applied before generation of the interrupt. In other embodiments or modes of operation, the system repeats the application of the same kernel sequence (rather than applying a new sequence) when the frame count reaches its predetermined maximum value.

In preferred embodiments in which the inventive system for dithering video data is operable in small kernel and large kernel modes, each kernel applied in the small kernel mode is a 2×2 array of dither bits and each kernel applied in the large kernel mode is a 4×4 array dither bits. Each kernel sequence repeats after a programmable number of the blocks (e.g., a programmable number of frames containing the blocks) have been dithered.

In typical embodiments, the system performs both truncation and dithering on words of video data. The truncation effectively discards a set of least-significant bits of each word, with or without rounding of the least significant remaining bit. The dithering effectively dithers the least significant remaining bit (or bits) of each truncated word. For example, some embodiments produce dithered 6-bit color components in response to 8-bit input color component words. In one preferred embodiment, the two least-significant bits of each input color component are discarded (truncation is performed without rounding) and the least-significant non-discarded bit is either incremented or not incremented according to a dithering algorithm that implements both spatial and temporal dithering.

Preferably, the inventive system is optionally operable in either a normal mode (in which dithering is applied to all pixels in accordance with the invention) or an anti-flicker mode. In a preferred anti-flicker mode, even numbered input pixels are dithered as in the normal mode (to generate even numbered output pixels), but at least one of the Q least significant bits of each odd numbered input pixel (or at least one color component thereof) is replaced by the corresponding bits (or bit) of an adjacent even input pixel (e.g., the previous input pixel) and the so-modified odd input pixel is then dithered in the same manner as the unmodified odd input pixel would be dithered in the normal mode. The anti-flicker mode can reduce artifacts that would otherwise be introduced by applying normal mode dithering to video data that has already been temporally dithered (e.g., where the normal mode dithering would "beat" against or amplify the prior dither effect to produce more noticeable flicker when the twice dithered video is displayed). Of course, pixels can be numbered arbitrarily (with the first pixel being considered as either an even or odd pixel) so that the terms "odd" and "even" can be reversed in the description of the anti-flicker mode. In another anti-flicker mode, the system disables temporal dithering and instead performs purely spatial dithering on frames of input pixels.

Preferably, a user can select an anti-flicker mode (e.g., the preferred anti-flicker mode described in the previous paragraph) whenever he or she perceives flicker that results from normal mode operation, which can occur when the input data has already been dithered by some other part of a computer system that includes the inventive dithering circuitry. For example, where software performs dithering on the data asserted to dithering hardware that embodies the invention, the inventive hardware can be placed in the anti-flicker mode. Preferably, the inventive system is also operable in a non-dithering mode, in which both normal mode and anti-flicker mode dithering is disabled (e.g., so that the system in the non-dithering mode truncates input pixels without dithering the input pixels, or displays non-truncated, non-dithered pixels). The disabling of all dithering (both spatial and temporal dithering) can result in the subjectively best-appearing display in some circumstances, but would not address some types of flickering that would be better addressed by operation in the preferred anti-flicker mode. When the inventive dithering system is to be used with a display device of a type known to be prone to a flickering problem addressed by the preferred anti-flicker mode, a CPU could configure the inventive dithering system to operate always in the preferred anti-flicker mode.

Another aspect of the invention is a computer system in which any embodiment of the inventive dithering system is implemented as a subsystem of a pipelined graphics processor, where the computer system also includes a CPU coupled and configured to configure and/or program the graphics processor (including its dithering subsystem), a frame buffer for receiving the output of the graphics processor, and a display device that is refreshed by the frame buffer contents. Another aspect of the invention is a display device in which any embodiment of the inventive dithering system is implemented as a subsystem. Such a display device can be used in a computer system that also includes a pipelined graphics processor, a CPU coupled to the graphics processor (and coupled and configured to configure and/or program the dithering subsystem of the display device), and a frame buffer that receives the output of the graphics processor and asserts such data to the display device.

DETAILED DESCRIPTION OF THE PREFERRED EMBODIMENTS

The term "array" of dither bits is used herein in a broad sense to denote an ordered set or pattern of dither bits to be applied to a block of video data. An array of dither bits need not be (and need not map to) a square or rectangular matrix whose elements are dither bits. The term "kernel" is used herein to denote an array of dither bits, and the expression "kernel sequence" is used herein to denote a sequence of dither bit arrays.

The term "block" of video words is used herein to denotes an ordered set of video words that maps to a square or rectangular array (whose elements are the video words). Thus, in variations on the embodiments described herein in which square (N×N or M×M) blocks of video words are processed, rectangular (X×Y) blocks of video words are processed.

Figure 1:
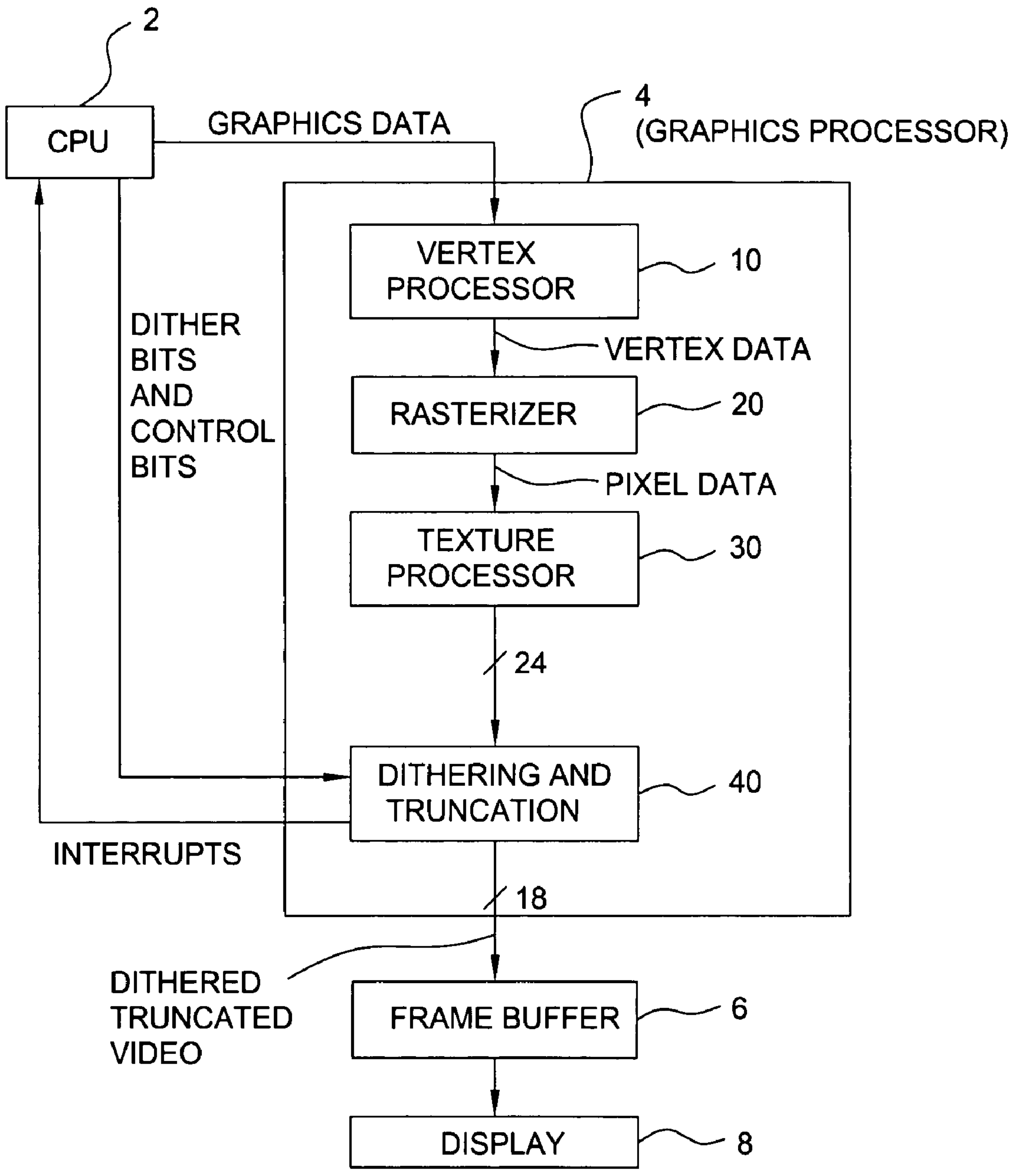
FIG. 1 is a block diagram of a system that embodies the invention.

The system of FIG. 1 includes CPU (central processing unit) 2, pipelined graphics processor 4 coupled and configured to generate pixels for display by display device 8. Dithered, truncated video data asserted at the output of graphics processor 4 are asserted to frame buffer 6, and consecutive frames of such video data are asserted by frame buffer 6 to display device 8. It is contemplated that graphics processor 4 of FIG. 1 can be implemented as an integrated circuit (or portion of an integrated circuit), with processor 4 and frame buffer 6 implemented as a graphics card. Alternatively, both frame buffer 6 and graphics processor 4 are elements of a single integrated circuit.

Within processor 4, vertex processor 10 operates in response to graphics data and control signals from CPU 2 to generate vertex data indicative of the coordinates of the vertices of each primitive (typically a triangle) of each image to be rendered, and attributes (e.g., color values) of each vertex. Rasterizer 20 generates pixel data in response to the vertex data from vertex processor 10. The pixel data are indicative of the coordinates of a full set of pixels for each primitive, and attributes of each pixel (e.g., color values for each pixel and values that identify one or more textures to be blended with each set of color values). Rasterizer 20 generates packets that include the pixel data and asserts the packets to texture processor 30.

Texture processor 30 can combine the pixel data received from rasterizer 20 with texture data. For example, texture processor 30 typically can generate a texel average in response to specified texels of one or more texture maps (e.g., by retrieving the texels from a memory coupled thereto, and computing an average of the texels of each texture map) and generate textured pixel data by combining a pixel with each of the texel averages. In some implementations, texture processor 30 can perform various operations in addition to (or instead of) texturing each pixel, such as one or more of the well known operations of culling, frustum clipping, polymode operations, polygon offsetting, fragmenting, format conversion, input swizzle (e.g., duplicating and/or reordering an ordered set of components of a pixel), scaling and biasing, inversion (and/or one or more other logic operations), clamping, and output swizzle.

Dithering and truncation processor 40 is coupled to receive the stream of processed pixels output from processor 30. Each pixel received at the input of processor 40 is a Y-bit word (e.g., a 24-bit word including three 8-bit color components, in a preferred implementation). Processor 40 is operable in at least one mode in which it converts the Y-bit words to X-bit words, where X is less than Y, including by performing dithering on components (e.g., color components) of each Y-bit word in accordance with the invention. In a typical mode of this type, processor 40 independently dithers different color components of the Y-bit words and generates truncated, dithered color components that determine each X-bit output word. The truncation discards a predetermined number, S, of the least-significant bits of each input word, with or without rounding of the least significant remaining bit. For example, in preferred embodiments, processor 40 receives 24-bit pixels and is operable in a mode in which it dithers 8-bit color component values and truncates the two least-significant-bits of each dithered value to generate fully processed, 18-bit output pixels, each comprising 6-bit color components. Preferably, processor 40 is also operable in a mode in which it passes through (without modification) the pixels it receives from processor 30.

Processor 40 asserts the fully processed pixels to frame buffer 6, and display device 8 displays a sequence of frames of pixels that have been written into frame buffer 6. In a class of embodiments, display device 8 is a flat panel display capable only of displaying pixels whose color components have 6-bit maximum length, processor 40 receives 24-bit pixels (each comprising three 8-bit color components) from processor 30 and is operable in at least one mode in which it dithers and truncates the 8-bit color component values to generate 18-bit output pixels (each comprising three 6-bit color components), and asserts the 18-bit output pixels to frame buffer 6. To support a cathode ray tube (or other) implementation of display device 8 that is capable of displaying pixels having 8-bit color components, an implementation of processor 40 that receives 24-bit pixels from processor 30 is operable in a mode in which it passes through to frame buffer 6 (without modification) the pixels it receives from processor 30.

In accordance with the invention, processor 40 can be implemented to be operable in any of several user-selectable modes to dither Y-bit (e.g., 8-bit) color component words and truncate the dithered words to produce X-bit (e.g., 6-bit) words for display. Processor 40 is preferably highly programmable, for example in response to control bits and dither bits from CPU 2. Such an implementation of processor 40 will be described with reference to FIG. 2.

Figure 2:
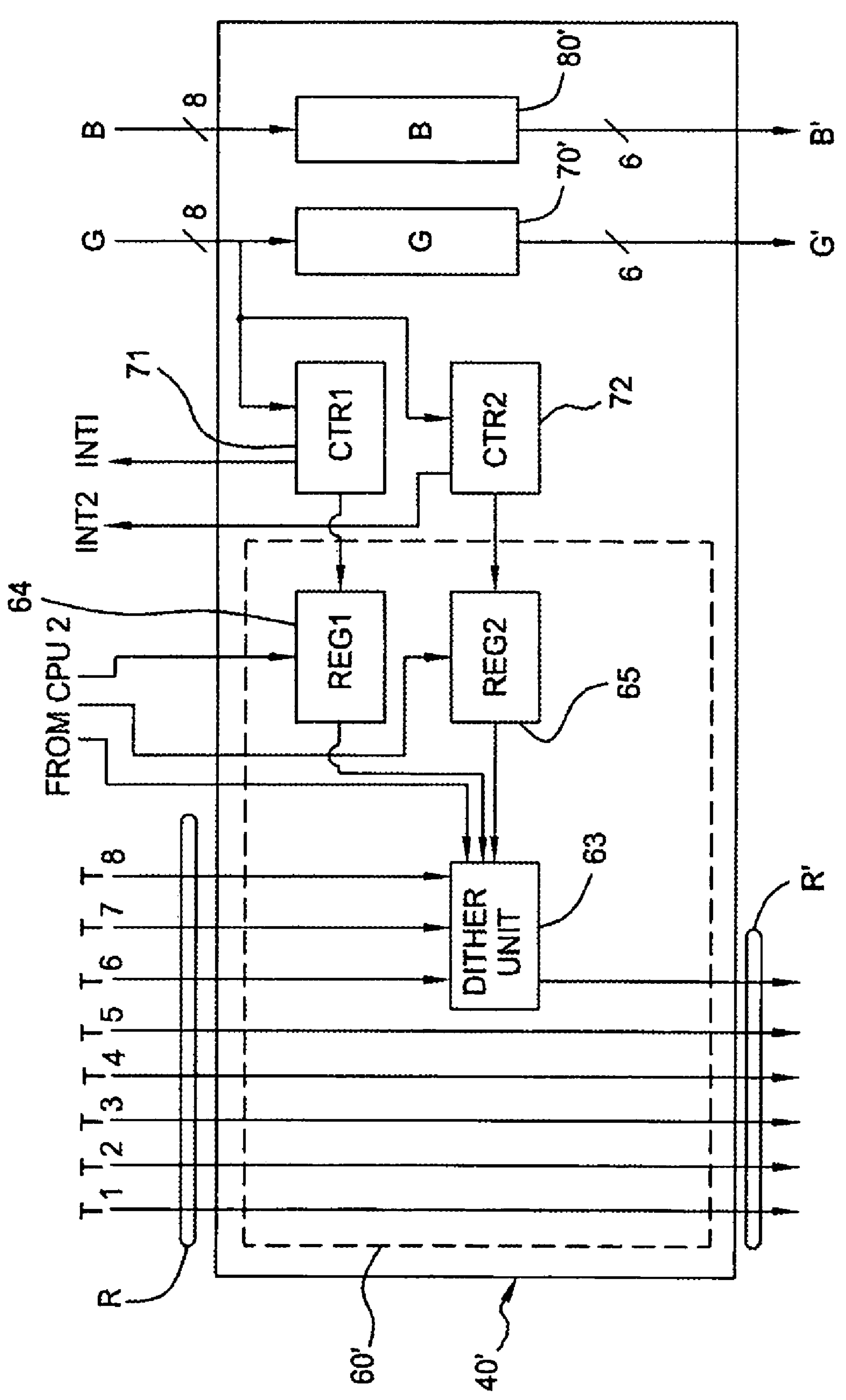
FIG. 2 is a block diagram of an embodiment of dithering and truncation processor 40 of the FIG. 1 system.

As shown in FIG. 2, processor 40 includes three identical processing pipelines: subsystem 60 (which receives 8-bit "Red" color components from processor 30), subsystem 70 (which receives 8-bit "Green" color components from processor 30), and subsystem 80 (which receives 8-bit "Blue" color components from processor 30). The FIG. 2 embodiment of processor 40 also includes frame counters 71 and 72.

We will denote the bits of each color component asserted to the input of processor 40 as $T_1T_2T_3T_4T_5T_6T_7T_8$, where $T_8$ is the least significant bit. Each of subsystems 60, 70 and 80 passes through the five most significant bits ($T_1T_2T_3T_4T_5$) of each color component asserted thereto, and each includes a dither unit 63 (coupled to receive the three least significant bits $T_6T_7T_8$ of each color component), dither bit register 64 (which can be loaded with dither bits of a first kernel sequence), and dither bit register 65 (which can be loaded with dither bits of a second kernel sequence). Preferably, processor 40 is operable in a mode in which dither unit 63 is disabled and processor 40 either passes through unchanged the least significant bits $T_6$, $T_7$, and $T_8$ of each color component as well as the five most significant bits (so that processor 40 performs neither truncation nor dithering), or pass through only the bit $T_6$ (in which case processor 40 performs truncation but not dithering).

Dither unit 63 is operable in at least one dithering mode in which it ignores and discards the bits $T_7$ and $T_8$ and asserts either an incremented or a non-incremented version of each bit $T_6$ in accordance with a dithering algorithm that implements both spatial and temporal dithering. In such mode, unit 63 determines the block to which the color component containing each bit $T_6$ belongs and the color component's position in the block, and determines whether to increment the bit $T_6$ by applying the algorithm.

In a small kernel mode, each frame of input data is partitioned into 2×2 blocks of color components, and each block has four elements $W_{ij}$, where $1 \leqq i \leqq 2$, $1 \leqq j \leqq 2$, and each element $W_{ij}$ is an 8-bit input color component. Unit 63 recognizes whether each input color component asserted to subsystem 60 is the first element $W_{11}$, second element $W_{12}$, third element $W_{21}$, or fourth element $W_{22}$ of a block. Unit 63 determines which of the input bits T 6 to increment in response to a first sequence of 2-bit×2-bit dither bit arrays (2-bit×2-bit "kernels") from register 64 and second sequence of 2-bit×2-bit kernels from register 65.

In the small kernel mode, a first kernel sequence is loaded into register 64 and a second kernel sequence is loaded into register 65. The first kernel sequence includes a dither bit for each of the first element $W_{11}$, second element $W_{12}$, third element $W_{21}$, and fourth element $W_{22}$ of the blocks of a first frame, another dither bit for each of the first element $W_{11}$, second element $W_{12}$, third element $W_{21}$, and fourth element $W_{22}$ of the blocks of the next frame, and so on for each of S different frames. The second kernel sequence includes a dither bit for each of the first element $W_{11}$, second element $W_{12}$, third element $W_{21}$, and fourth element $W_{22}$ of the blocks of the first frame, another dither bit for each of the first element $W_{11}$, second element $W_{12}$, third element $W_{21}$, and fourth element $W_{22}$ of the blocks of the next frame, and so on for each of T different frames.

Each of the values S and T is a predetermined (and preferably programmable) number. Counter 71 is configured to count cyclically from 1 to S, counter 72 is configured to count cyclically from 1 to T, and each counter increments its count at the end of each frame of input data received by processor 40.

During a first frame, unit 63 applies a first dither bit pair from the current kernels (one dither bit from each of registers 64 and 65) for each "first" element $W_{11}$ of a block, a second pair of dither bits (one from each of registers 64 and 65) for each "second" element $W_{12}$ of a block, a third pair of dither bits (one from each of registers 64 and 65) for each "third" element $W_{21}$ of a block, and a fourth pair of dither bits (one from each of registers 64 and 65) for each "fourth" element $W_{22}$ of a block. Unit 63 implements a look-up table that responds to the relevant one of the current dither bit pairs (i.e., the first pair when the current bit $T_6$ belongs to a "first" element $W_{11}$ of a block) by determining whether or not to increment the current bit $T_6$ at unit 63's input. Unit 63 outputs either the incremented or non-incremented version of $T_6$ as the LSB of the six-bit (truncated and dithered) color component R' output from subsystem 60.

During the next frame, each of registers 64 and 65 asserts a different kernel to unit 63 (register 64 asserts the next kernel of the first kernel sequence; register 65 asserts the next kernel of the second kernel sequence). Unit 63 applies a first dither bit pair from the current kernels (one dither bit from each of registers 64 and 65) for each "first" element $W_{11}$ of a block, a second pair of dither bits (one from each of registers 64 and 65) for each "second" element $W_{12}$ of a block, and so on. According to the same look-up table (the table applied during processing of the previous frame), unit 63 responds to the relevant one of the current dither bit pairs by determining whether or not to increment the bit $T_6$ currently asserted at unit 63's input, and unit 63 outputs either the incremented or non-incremented version of $T_6$ as the LSB of the six-bit truncated, dithered color component output from subsystem 60.

This process continues until S frames have been processed, at which time register 64 responds to counter 71's frame count by commencing another cycle of assertion of the first kernel sequence to unit 63. When T frames have been processed, register 65 responds to counter 72's frame count by commencing another cycle of assertion of the second kernel sequence to unit 63. Thus, the overall operating cycle of unit 63 has a period of S*T frames. When S*T frames have been dithered, the process can be repeated to dither the next S*T frames. In a typical implementation, each of S and T can have any value in the range from 1 through 16. If S=13 and T=15, the overall sequence repeats every 13*15=195 frames.

Preferably, CPU 2 (shown in FIG. 1) can load new kernel sequences into each of registers 64 and 65. The FIG. 2 implementation of processor 40 can effectively apply longer kernel sequences by loading new kernel sequences into the registers with appropriate timing. For example, processor 40 can operate in a mode (e.g., in response to one or more control signals from CPU 2) in which counter 71 asserts an interrupt ("INT1") to CPU 2 whenever its frame count reaches its maximum value, and in which counter 72 asserts an interrupt ("INT2") to CPU 2 whenever its frame count reaches its maximum value. In response to each interrupt INT1, CPU 2 loads a new set of dither bits into register 64 (these bits can be thought of as determining a new "first" kernel sequence or a next segment of the original "first" kernel sequence), and the new dither bits are applied to dither the next S frames of input color components. Similarly, in response to each interrupt INT2, CPU 2 loads a new set of dither bits into register 65 (these bits can be thought of as determining a new "second" kernel sequence or a next segment of the original "second" kernel sequence), and these new dither bits are applied to dither the next T frames of input color components.

Arbitrarily long pseudorandom kernel sequences are supported, since CPU 2 (or another external device) can generate such a pseudorandom kernel sequence and download portions of the sequence to a kernel memory (e.g., register 64 or 65) in response to interrupts from frame counters.

Preferably, CPU 2 can read the current frame value (from each of counters 71 and 72) during each VSYNC interrupt and can write new dither bits to areas of register 64 (or register 65) that are not currently being used.

The FIG. 2 implementation of processor 40 is also operable in a large kernel mode in which each frame of input data is partitioned into 4×4 blocks of color components, and each block has sixteen elements $W_{ij}$, where $1 \leqq i \leqq 4$, $1 \leqq j \leqq 4$, and each element $W_{ij}$ is an 8-bit input color component. Unit 63 recognizes each input color component asserted to subsystem 60 as being a first, second, third, fourth, fifth, sixth, seventh, eighth, ninth, tenth, eleventh, twelfth, thirteenth, fourteenth, fifteenth, or sixteenth element of a block. Unit 63 determines which of the input bits $T_6$ to increment in response to a first sequence of 4-bit×4-bit dither bit arrays (4-bit×4-bit "kernels") from register 64 and second sequence of 4-bit×4-bit kernels from register 65.

In the large kernel mode, a first kernel sequence is loaded into register 64 and a second kernel sequence is loaded into register 65. The first kernel sequence includes a dither bit for each of the sixteen elements, $W_{ij}$, of the blocks of a first frame, another dither bit for each of the sixteen elements of the blocks of the next frame, and so on for each of U different frames. The second kernel sequence includes a dither bit for each of the sixteen elements of the blocks of the first frame, another dither bit for each of the sixteen elements of the blocks of the next frame, and so on for each of V different frames.

Each of the values U and V is a predetermined (and preferably programmable) number. Typically, U and V will be smaller than the values S and T mentioned above in connection with the small kernel mode, since the same registers 64 and 65 are used in both the large and small kernel modes. Counter 71 is configured to count cyclically from 1 to U, including by incrementing its count at the end of each frame of input data received by processor 40. Counter 72 is configured to count cyclically from 1 to V, including by incrementing its count at the end of each frame of input data received by processor 40.

During a first frame, unit 63 applies a first dither bit pair from the current kernels (one dither bit from each of registers 64 and 65) for each "first" element $W_{11}$ of a block, a second pair of dither bits (one from each of registers 64 and 65) for each "second" element $W_{12}$ of a block, and so on for each of the sixteen different elements of a block. Unit 63 implements a large kernel look-up table that responds to the relevant one of the current dither bit pairs (i.e., the sixteenth pair when the current bit $T_6$ belongs to a "sixteenth" element $W_{44}$ of a block) by determining whether or not to increment the current bit $T_6$ at unit 63's input. Unit 63 outputs either the incremented or non-incremented version of $T_6$ as the LSB of the six-bit (truncated and dithered) color component R' output from subsystem 60.

During the next frame, each of registers 64 and 65 asserts a different kernel to unit 63 (register 64 asserts the next kernel of the first kernel sequence; register 65 asserts the next kernel of the second kernel sequence). Unit 63 applies a first dither bit pair from the current kernels (one dither bit from each of registers 64 and 65) for each "first" element $W_{11}$ of a block, a second pair of dither bits (one from each of registers 64 and 65) for each "second" element $W_{12}$ of a block, and so on. According to the same large kernel look-up table (the table applied during processing of the previous frame), unit 63 responds to the relevant one of the current dither bit pairs by determining whether or not to increment the bit T6 currently asserted at unit 63's input, and unit 63 outputs either the incremented or non-incremented version of $T_6$ as the LSB of the six-bit truncated, dithered color component output from subsystem 60.

This process continues until U frames have been processed, at which time register 64 responds to counter 71's frame count by commencing another cycle of assertion of the first kernel sequence to unit 63. When V frames have been processed, register 65 responds to counter 72's frame count by commencing another cycle of assertion of the second kernel sequence to unit 63. Thus, the overall operating cycle of unit 63 in the large kernel mode has a period of U*V frames. When U*V frames have been dithered, the process can be repeated (to dither the next U*V frames). New kernel sequences are optionally loaded into each of registers 64 and 65 (from CPU 2) in response to interrupts from frame counters 71 and 72.

Each look-up table implemented by unit 63 implements spatial dithering in accordance with the invention.

The FIG. 2 processor can apply six different predetermined kernel sequences to dither a sequence of input pixels: two kernel sequences for a first component (e.g., the Red component) of each pixel; two different kernel sequences for a second component (e.g., the Green component) of each pixel; and two different kernel sequences for a third component (e.g., the Blue component) of each pixel.

The FIG. 2 implementation of processor 40 is preferably also configured to operate in an anti-flicker mode (e.g., in response to a control signal from CPU 2).

In such an implementation, processor 40 is optionally operable in either a normal mode (e.g., any of the above-mentioned modes in which dithering is applied to all pixels in accordance with the invention) or in the anti-flicker mode. In the anti-flicker mode, unit 63 dithers even numbered color components as in a normal mode (so that subsystem 60 generates even-numbered, 6-bit output color components as in the normal mode) but unit 63 stores bit $T_6$ of the most recently received even input color component. Unit 63 then replaces bit $T_6$ of the next input color component (which is an odd-numbered color component) with the stored bit of the previous even color component, and unit 63 then dithers (i.e., increments or does not increment) the so-modified odd color component in the same manner as the unmodified odd color component would be dithered in the normal mode.

The anti-flicker mode can reduce artifacts that would otherwise be introduced by applying normal mode dithering to already-dithered input data (e.g., where the normal mode dithering would "beat" against or amplify the prior dither effect to produce more noticeable flicker when the twice dithered video is displayed). Of course, pixels can be numbered arbitrarily (with the first pixel being considered as either an even or odd pixel) so that the terms "odd" and "even" can be reversed in the preceding description of the anti-flicker mode.

When the inventive dithering system is to be used with a display device of a type known to be prone to a flickering problem addressed by the anti-flicker mode, a CPU could configure the inventive dithering system to operate always in the anti-flicker mode.

Processor 40 can be implemented in many other ways in accordance with the invention. In some alternative embodiments of processor 40, only one kernel sequence is applied (e.g., register 65 and counter 72 are omitted). In other alternative embodiments, processor 40 performs dithering only (and not truncation).

In other alternative embodiments, circuitry other than that shown in FIG. 2 is employed to perform dithering and/or truncation. The truncation can be done with or without rounding of the least significant bit of each truncated output word.

Figure 3:
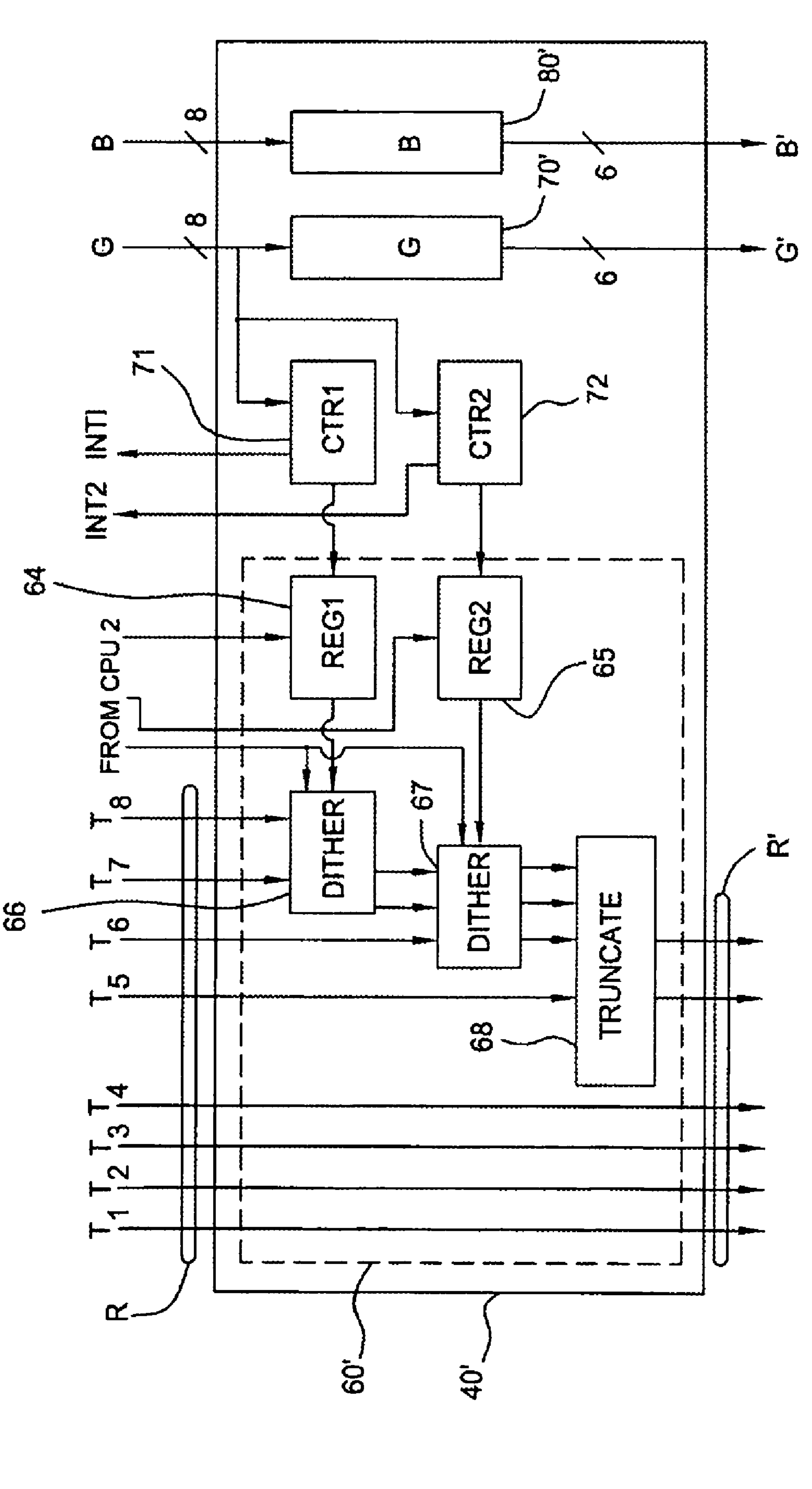
FIG. 3 is a block diagram of an alternative embodiment of processor 40 of FIG. 1.

For example, the FIG. 3 embodiment of processor 40 is an alternative embodiment in which truncation is performed with rounding. The elements of FIG. 3 that are identical to those of FIG. 2 are numbered identically in FIGS. 2 and 3 and the above description of them will not be repeated with reference to FIG. 3. The FIG. 3 embodiment includes three identical processing pipelines: subsystem 60' (which receives 8-bit "Red" color components from processor 30), subsystem 70' (which receives 8-bit "Green" color components from processor 30), and subsystem 80' (which receives 8-bit "Blue" color components from processor 30).

Subsystem 60' passes through the four most significant bits ($T_1T_2T_3T_4$) of each color component asserted thereto, and includes dither unit 66 (coupled to receive the two least significant bits $T_7T_8$ of each color component), dither unit 67 (coupled to receive bit $T_6$ of each color component and a carry bit from unit 66), and truncation unit 68 (coupled to receive bit Ts of each color component, the output bits from units 66 and 67).

Dither unit 66 is operable in at least one dithering mode in which it determines the block to which the current color component belongs and the color component's position in the block, and adds a dither bit (from register 64) to $T_7T_8$. The result is asserted to dither until 67. Unit 67 is operable in at least one dithering mode in which it determines the block to which the current color component belongs and the color component's position in the block, and adds a dither bit (from register 65) to the output of unit 66 concatenated with bit $T_6$. The result is asserted to truncation unit 68. In response to the dithered value from unit 67 and bit $T_5$, unit 68 asserts the two most significant bits of a rounded version of the output of unit 67 concatenated with bit $T_5$.

Sequences of kernels can be asserted (with the same timing) from registers 64 and 65 to units 66 and 67 in FIG. 3 as are asserted from registers 64 and 65 (to unit 63) in FIG. 2. For example, during a first frame (in a small kernel mode of the FIG. 3 processor) unit 66 applies (i.e., adds) a first dither bit from the current kernel (from register 64) to bits $T_7T_8$ of each "first" element $W_{11}$ of a block, a second dither bit (from register 64) to bits $T_7T_8$ of each "second" element $W_{12}$ of a block, a third dither bit (from register 64) to bits $T_7T_8$ of each "third" element $W_{21}$ of a block, and a fourth dither bit (from register 64) to bits $T_7T_8$ of each "fourth" element $W_{22}$ of a block. During the first frame (in the same small kernel mode), unit 67 applies a first dither bit from the current kernel (from register 65) to each word that includes bit $T_6$ of a "first" element $W_{11}$ of a block, a second dither bit (from register 65) to each word that includes bit $T_6$ of a "second" element $W_{12}$ of a block, a third dither bit (from register 65) to each word that includes bit $T_6$ of a "third" element $W_{21}$ of a block, and a fourth dither bit (from register 65) to each word that includes bit $T_6$ of a "fourth" element $W_{22}$ of a block. During the next frame, the dither bits applied by unit 66 belong to the next kernel of the first kernel sequence stored in register 64, and the dither bits applied by unit 67 belong to the next kernel of the second kernel sequence stored in register 65.

More generally, in a class of embodiments the invention is a programmable system for dithering video data. The system is operable in at least two user-selectable modes, which can include at least one "small kernel" mode and at least one "large kernel" mode. In a small kernel mode, the system applies a sequence of kernels (e.g., N bit×N bit kernels) to blocks (e.g., N×N blocks) of video words. In a large kernel mode, the system applies a sequence of larger kernels (e.g., M bit×M bit kernels, where M>N) to larger blocks (e.g., M×M blocks) of video words. Each sequence comprises a predetermined, and preferably programmable, number of kernels and the sequence repeats after a predetermined number of video blocks have been dithered. Typically but not necessarily, one kernel in the sequence is repeatedly applied to blocks of one video frame, the next kernel in the sequence is then repeatedly applied to blocks of the next video frame, and so on until each kernel has been applied to a different frame (at which point the process can repeat or new sequence of kernels can be applied). In some embodiments, each dither bit of each kernel of a kernel sequence is added to a specific bit of a video word (i.e., to the "P"th bit of the word, which can be the least significant bit). The system can store a finite number of predetermined dither bits in one or more registers. Dither bits of a relatively short sequence of large kernels can be stored in the same volume of memory (e.g., a register block of fixed size) as can the dither bits of a longer sequence of small kernels.

In another class of embodiments, the inventive system is operable in at least one mode in which it applies two or more kernels (each from a different kernel sequence) to each block of video words. In some such embodiments, a kernel of a first kernel sequence is applied to the least significant bits (LSBs) of the words of each block of one frame (e.g., by adding one dither bit of the kernel to the LSB of each word) and a kernel of a second kernel sequence is applied to the next-least-significant bits of the words of each block of the same frame. Then, the next kernel of the first kernel sequence is applied to the LSBs of the words of each block of the next frame and the next kernel of the second kernel sequence is applied to the next-least-significant bits of the words of each block of the same frame, and so on for subsequent frames. Typically, the kernels of all sequences have the same size but this is need not be the case (for example, a sequence of large kernels and a sequence of small kernels can be simultaneously applied).

Typically, each kernel sequence is applied repeatedly but the period of repetition need not be the same for all simultaneously applied sequences. Preferably, the period of repetition is programmable independently for each sequence. For example, in one embodiment, a first kernel sequence comprises S kernels and a second kernel sequence comprises T kernels (where S and T are programmable numbers), and the following operations are performed simultaneously: the first kernel sequence is applied repeatedly (with a period of S frames) to successive groups of data blocks (each group consisting of S frames of data blocks), and the second kernel sequence is applied repeatedly (with a period of T frames) to successive groups of the same data blocks (each group consisting of T frames of data blocks). In this way, the overall period of repetition of the combination of both sequences is U frames, where U=S*T.

Regardless of the number of kernel sequences applied to a stream of data blocks, the system preferably includes a frame counter for each kernel sequence. Each counter preferably generates an interrupt when the frame count (the number of frames of data dithered by kernels of the sequence) has reached a predetermined value (preferably a programmable value). In response to the interrupt, software can change the kernel sequence being applied, thus effectively causing the system to apply a longer kernel sequence. For example, in response to the interrupt, a CPU can cause a new set of dither bits to be loaded into a register to replace dither bits that had been stored and applied before generation of the interrupt. In other embodiments or modes of operation, the system repeats the application of the same kernel sequence (rather than applying a new sequence) when the frame count reaches its predetermined maximum value.

In typical embodiments, the system performs both truncation and dithering on words of video data. The truncation effectively discards a set of least-significant bits of each word, with or without rounding of the least significant remaining bit. The dithering effectively dithers the least significant remaining bit (or bits) of each truncated word. In one preferred embodiment, the two least-significant bits of each input color component are discarded (truncation is performed without rounding) and the least-significant non-discarded bit is either incremented or not incremented according to a dithering algorithm that implements both spatial and temporal dithering.

Preferably, the inventive system is optionally operable in either a normal mode (in which dithering is applied to all pixels in accordance with the invention) or in an anti-flicker mode. In the anti-flicker mode, even numbered input pixels are dithered as in the normal mode (to generate even numbered output pixels), but at least one of the Q least significant bits of each odd numbered input pixel are (is) replaced by the corresponding bits (bit) of an adjacent even input pixel (e.g., the previous input pixel) and the so-modified odd input pixel is then dithered in the same manner as the unmodified odd input pixel would be dithered in the normal mode. For example, the two least significant bits of each odd numbered input pixel are replaced by the two least significant bits of the previous input pixel (which is an even numbered pixel). The anti-flicker mode can reduce artifacts that would otherwise be introduced by applying normal mode dithering to already-dithered video data (e.g., where the normal mode dithering would "beat" against or amplify the prior dither effect to produce more noticeable flicker when the twice dithered video is displayed). Of course, pixels can be numbered arbitrarily (with the first pixel being considered as either an even or odd pixel) so that the terms "odd" and "even" can be reversed in describing the invention. Preferably, a user can select the anti-flicker mode whenever he or she perceives flicker that results from normal mode operation, which can occur when the input data has already been dithered by some other part of a computer system that includes the inventive dithering circuitry. For example, where some software performs dithering on the data asserted to dithering hardware that embodies the invention, the inventive hardware can be placed in the anti-flicker mode. Preferably, the inventive system is also operable in a non-dithering mode, in which both normal mode and anti-flicker mode dithering is disabled (e.g., so that the system in the non-dithering mode truncates input pixels without dithering the input pixels, or displays non-truncated, non-dithered pixels). The disabling of all dithering (including anti-flicker mode dithering) can result in the subjectively best-appearing display in some circumstances, but would not address some types of flickering that would be better addressed by operation in the anti-flicker mode.

Another aspect of the invention is a computer system (e.g., that of FIG. 1) in which any embodiment of the inventive dithering system is implemented as a subsystem of a pipelined graphics processor (e.g., processor 40 of FIG. 1), where the computer system also includes a CPU coupled and configured to configure and/or program the graphics processor (including its dithering subsystem), a frame buffer for receiving the output of the graphics processor (or a version of such output that has undergone further processing), and a display device for displaying frames of data in the frame buffer.

Figure 4:
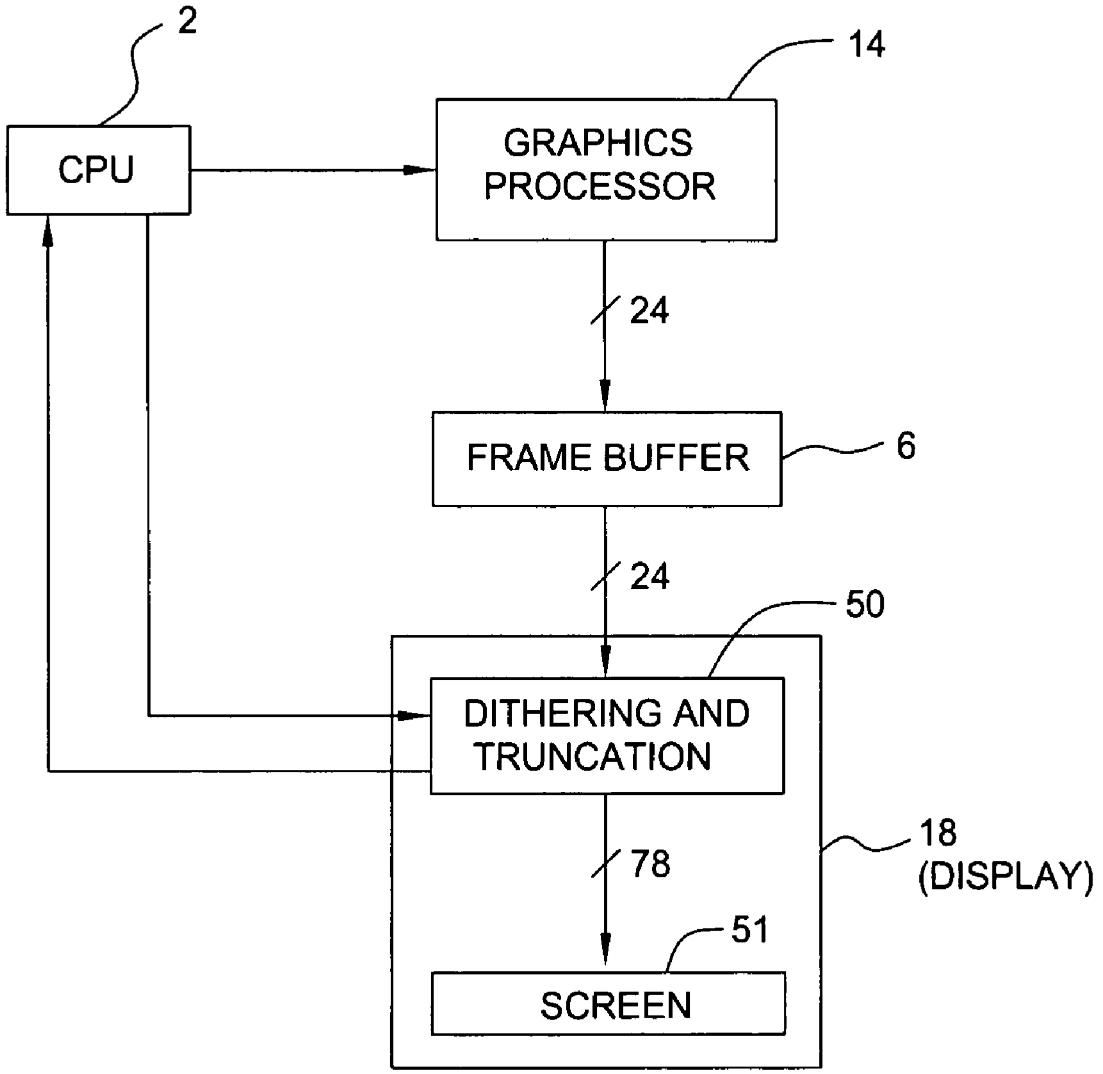
FIG. 4 is a block diagram of another system that embodies the invention.

Another aspect of the invention is a display device in which any embodiment of the inventive dithering system is implemented as a subsystem. For example, display device 18 of the computer system of FIG. 4 includes dithering and truncation subsystem 50 which is an embodiment of the inventive dithering system. Subsystem 50 can be operated in at least one mode in which it receives 24-bit pixels (comprising 8-bit color components) from frame buffer 6 and generates in response 18-bit dithered pixels (comprising 6-bit color components) for display on display screen 51. Subsystem 50 can be any embodiment of unit 40 of the FIG. 1 system, including any of the embodiments described with reference to FIG. 2. The computer system of FIG. 4 also includes pipelined graphics processor 14 (which can be identical to processor 4 of FIG. 1 with unit 40 removed therefrom), CPU 2 coupled to graphics processor 2 (and coupled and configured to configure and/or program subsystem 50 of display device 18), and frame buffer 6 that receives the output of graphics processor 14 and asserts frames of such data to display device 18.

In a class of embodiments, the invention is a system for dithering video data that simultaneously applies at least two different repeating sequences of dither bit kernels to blocks of video words. Preferably, but not necessarily, the system is programmable. In some embodiments in this class, each dither bit in a first kernel sequence is applied to the "P"th bit of a video word, each dither bit in a second kernel sequence is applied to the "Q"th bit of the video word. In other embodiments in this class, the two kernel sequences are not applied to different bits of each input word but are instead used together to determine how to dither each input word (e.g., as a result of look-up table operation such as that described above with reference to unit 63 of FIG. 2). Typically, each kernel sequence repeats after video bits of a predetermined (and preferably programmable) number of frames have been dithered by such kernel sequence.

In some embodiments in the noted class, each dither bit of each kernel in the first kernel sequence is applied to the least significant bit (LSB) of one color component, and each dither bit of each kernel in the second kernel sequence is applied to the next-least-significant bit of the color component. Thus, the system independently dithers the LSBs and the next-least-significant-bits of the input video. The independent dithering is preferably done in a programmable manner. For example, one implementation of the system applies a first kernel sequence (comprising N-bit×N-bit kernels) to the LSBs of the video words of a sequence of N×N video word blocks (one kernel in the sequence is repeatedly applied to blocks of one video frame, then the next kernel in the sequence is repeatedly applied to blocks of the next frame, and so on), application of the first kernel sequence repeats after a programmable number (X) of frames containing such blocks have been dithered, the system applies a second kernel sequence (comprising N-bit×N-bit kernels) to the next-to-least significant bits of the video words of a sequence of N×N video word blocks, and the second kernel sequence repeats after a programmable number (Y) of frames containing such blocks have been dithered. The overall sequence of dither bits applied to the two least-significant bits of the video words repeats after X·Y frames of the video words have been dithered.

As noted, temporal dither is implemented in accordance with the invention, to avoid significant perceived flicker during viewing of the resulting video frames, by applying at least one repeating sequence of kernels having a sufficiently long period of repetition. Preferably, a user can control the period of each sequence. In the typical case that the invention is implemented in the context of truncation of Y-bit words to X-bit words (where X<Y) and display of frames of the truncated dithered words, the inventive system responds to S frames of Y-bit input words by producing a sequence of S frames of truncated, dithered X-bit words. In a typical embodiment, X=6, Y=8, and each 8-bit input word (having bits $T_1T_2T_3T_4T_5T_6T_7T_8$, where "$T_8$" is the least significant bit) is converted to a truncated, dithered 6-bit output word whose bits are $T_1T_2T_3T_4T_5E$ (where "E" is the least significant bit). Where $E_1, E_2, \ldots E_{s-1}$, and $E_s$ are the least significant bits of each sequence of S output words to be displayed at the same location on the display screen (e.g., each as a color component of the "N"th pixel of the "M"th line of a different frame), the R values are chosen to implement spatial dithering of each frame. In some embodiments (in which truncation is performed without rounding), the time average of the values R (where "i" ranges from 1 to S) equals the time averaged value of the bits $T_6$ of the corresponding input words. In other embodiments (e.g., where truncation is performed with rounding), the time average of the three-bit values $E_i$00 (of which $E_i$ is the most significant bit, and where "i" ranges from 1 to S) equals the time averaged value of the three-bit portions ($T_6T_7T_8$) of the corresponding input words, and the time average of the bits $E_i$ (where $1 \leqq i \leqq S$) is the time average of a rounded version of bit $T_6$ of the input words. Each specific sequence of dithered bits $E_i$ (including the period, S, of the sequence) is chosen to implement spatial dithering of each frame of the output data without perceived flicker.

To implement spatial dithering, the inventive system preferably determines blocks of each frame of input video data (such that each block consists of data to be displayed in a different small compact region of the display screen) and applies at least one kernel of dither bits to each block (e.g., with each dither bit of a kernel being applied to dither one color component of the block). Typically, three sets of blocks are determined for each frame (each set comprising color components of a different color) and the kernels applied to each set of blocks are independently chosen. In accordance with preferred embodiments of the invention, each kernel is chosen so that it adds noise to a small number of pixels to be displayed adjacent to each displayed pixel so as to avoid banding and other artifacts that would otherwise result from processing of the video data for display.

It should be understood that while certain forms of the invention have been illustrated and described herein, the invention is not to be limited to the specific embodiments described and shown.

What is claimed is:

1. A programmable system for dithering video data, wherein the system is operable in at least a first mode and a second mode, the system in the first mode applies a first kernel sequence to sets of input video bits and repeats application of the first kernel sequence after a first number of the sets have been dithered, the system in the second mode applies a second kernel sequence to sets of input video bits and repeats application of the second kernel sequence after a second number of the sets have been dithered, each said kernel sequence is a sequence of kernels consisting of dither bits, at least one dither parameter of the first mode is programmable, and at least one dither parameter of the second mode is programmable.

2. The system of claim 1, wherein the system is configured to operate in the first mode while operating in the second mode, to apply the first kernel sequence and the second kernel sequence to blocks of video words, to repeat application of the first kernel sequence after X frames of the blocks have been dithered, and to repeat application of the second kernel sequence after Y frames of the blocks have been dithered, X and Y being integers.

3. The system of claim 1, wherein the first kernel sequence is a sequence of small kernels, the second kernel sequence is a sequence of large kernels, each of the small kernels is applied to a block of S video words, each of the large kernels is applied to a block of T video words, where S and T are numbers and T is larger than S, the first kernel sequence repeats after X frames of the blocks of S video words have been dithered, the second kernel sequence repeats after Y frames of the blocks of T video words have been dithered, and at least one of X and Y is programmable.

4. The system of claim 3, wherein each of the small kernels is an N bit×N bit kernel, each said block of S video words is an N×N block of the video words, each of the large kernels is an M bit×M bit kernel, where M>N, and each said block of T video words is an M×M block of the video words.

5. The system of claim 4, wherein N=2 and M=4.

6. The system of claim 3, wherein each of the video words is a color component word.

7. The system of claim 1, wherein the system is configured to operate in the first mode while operating in the second mode, and to apply the first kernel sequence and the second kernel sequence to blocks of color component words of a first type while applying a third kernel sequence to blocks of color component words of a second type.

8. The system of claim 7, wherein the color component words of the first type are red color component words, and the color component words of the second type are green color component words.

9. The system of claim 7, wherein the system is also configured to apply a fourth kernel sequence to blocks of color component words of the second type while applying the third kernel sequence to blocks of color component words of the second type.

10. The system of claim 1, wherein the system includes a memory that stores the kernels of the first kernel sequence, and the system is configured to assert an interrupt when operating in the first mode whenever said first number of the sets have been dithered, and to store in the memory an updated set of kernels of the first sequence, when said updated set of kernels is received at the memory, in response to assertion of the interrupt.

11. The system of claim 1, wherein each of the sets of input video bits is a block of video words of a frame of the video words, the system is configured to apply a first kernel of the first kernel sequence repeatedly to blocks of one said frame of the video words and then apply a second kernel of the first kernel sequence repeatedly to blocks of a subsequent frame of the video words, the system is configured to apply a first kernel of the second kernel sequence repeatedly to blocks of one said frame of the video words and then apply a second kernel of the second kernel sequence repeatedly to blocks of a subsequent frame of the video words, the first kernel sequence repeats after X frames of the video words have been dithered, and the second kernel sequence repeats after Y frames of the video words have been dithered, X and Y being integers.

12. The system of claim 11, wherein X is a programmable number, and the system includes memory that stores a sufficient number of the kernels of the first kernel sequence so that the system is operable in the first mode using only prestored kernels of the first kernel sequence when X is any user-selected number in a range from 1 through $X_{max}$.

13. The system of claim 12, wherein the system is configured to assert an interrupt when operating in the first mode whenever X frames of the video words have been dithered, and to store in the memory an updated set of kernels of the first sequence, when said updated set of kernels is received at the memory, in response to assertion of the interrupt.

14. The system of claim 13, wherein Y is a programmable number, and the memory stores a sufficient number of the kernels of the second kernel sequence so that the system is operable in the second mode using only pre-stored kernels of the second kernel sequence when Y is any user-selected number in a range from 1 through $Y_{max}$.

15. The system of claim 1, wherein the system applies the first kernel sequence to blocks of video words, and the system is configured to generate a truncated, dithered word in response to each video word in each of said blocks.

16. A pipelined graphics processor including programmable circuitry for dithering video data, wherein the circuitry is operable in at least a first mode and a second mode, the circuitry in the first mode applies a first kernel sequence to sets of input video bits and repeats application of the first kernel sequence after a first number of the sets have been dithered, the circuitry in the second mode applies a second kernel sequence to sets of input video bits and repeats application of the second kernel sequence after a second number of the sets have been dithered, each said kernel sequence is a sequence of kernels consisting of dither bits, at least one dither parameter of the first mode is programmable, and at least one dither parameter of the second mode is programmable.

17. A display device including programmable circuitry for dithering video data, wherein the circuitry is operable in at least a first mode and a second mode, the circuitry in the first mode applies a first kernel sequence to sets of input video bits and repeats application of the first kernel sequence after a first number of the sets have been dithered, the circuitry in the second mode applies a second kernel sequence to sets of input video bits and repeats application of the second kernel sequence after a second number of the sets have been dithered, each said kernel sequence is a sequence of kernels consisting of dither bits, at least one dither parameter of the first mode is programmable, and at least one dither parameter of the second mode is programmable.

18. The display device of claim 17, wherein the circuitry is configured to apply the first kernel sequence to blocks of video words, and the circuitry is configured to generate a truncated, dithered word in response to each video word in each of said blocks.

19. A computer system, including:

a CPU;

a graphics processor coupled to the CPU and configured to generate video data in response to data from the CPU; and a display device coupled and configured to receive and display frames of the video data, wherein the graphics processor includes:

a first subsystem configured to generate Y-bit video words; and a second subsystem configured to generate the video data in response to the Y-bit video words, such that the video data are X-bit dithered video words, where X<Y, wherein the second subsystem is operable to generate the X-bit dithered video words in a selected one of at least a first mode and a second mode in response to at least one control signal from the CPU, the second subsystem in the first mode applies a first kernel sequence to blocks of the Y-bit video words and repeats application of the first kernel sequence after a first number of the blocks have been dithered, the second subsystem in the second mode applies a second kernel sequence to blocks of the Y-bit video words and repeats application of the second kernel sequence after a second number of the blocks have been dithered, each said kernel sequence is a sequence of kernels consisting of dither bits, at least one dither parameter of the first mode is programmable in response to at least one control signal from the CPU, and at least one dither parameter of the second mode is programmable in response to at least one control signal from the CPU, X and Y being integers.

* * * * *